(12) United States Patent
Pieler et al.

(10) Patent No.: US 10,989,764 B2
(45) Date of Patent: Apr. 27, 2021

(54) METHOD AND DEVICE FOR LOCALIZING AN INSULATION FAULT IN AN OPERATING ELECTRICAL EQUIPMENT CONNECTED TO A POWER SUPPLY SYSTEM

(71) Applicant: BENDER GMBH & CO. KG, Gruenberg (DE)

(72) Inventors: Dirk Pieler, Gruenberg (DE); Joachim Wagner, Huettenberg (DE)

(73) Assignee: BENDER GMBH & CO. KG, Gruenberg (DE)

( * ) Notice: Subject to any disclaimer, the term of this patent is extended or adjusted under 35 U.S.C. 154(b) by 0 days.

(21) Appl. No.: 16/325,789

(22) PCT Filed: Aug. 17, 2017

(86) PCT No.: PCT/EP2017/070819
§ 371 (c)(1),
(2) Date: Feb. 15, 2019

(87) PCT Pub. No.: WO2018/041638
PCT Pub. Date: Mar. 8, 2018

(65) Prior Publication Data
US 2019/0219626 A1 Jul. 18, 2019

(30) Foreign Application Priority Data
Aug. 31, 2016 (DE) ...................... 10 2016 216 450.3

(51) Int. Cl.
*G01R 31/08* (2020.01)
*G01R 27/18* (2006.01)
*G01R 31/50* (2020.01)

(52) U.S. Cl.
CPC ............ *G01R 31/50* (2020.01); *G01R 31/08* (2013.01)

(58) Field of Classification Search
CPC ................................ G01R 31/50; G01R 31/08
See application file for complete search history.

(56) References Cited

U.S. PATENT DOCUMENTS

| 6,539,287 B1 | 3/2003 | Ashizawa | |
| 2012/0113555 A1* | 5/2012 | Mousavi | H02H 3/40 361/78 |
| 2017/0331293 A1* | 11/2017 | Narla | H02J 7/35 |

FOREIGN PATENT DOCUMENTS

| CN | 1258845 A | 7/2000 |
| CN | 1274976 A | 11/2000 |

(Continued)

OTHER PUBLICATIONS

English Abstract Translation of CN103201921A dated Jul. 10, 2013.
(Continued)

*Primary Examiner* — Clayton E. LaBalle
*Assistant Examiner* — Michael A Harrison
(74) *Attorney, Agent, or Firm* — King & Schickli, PLLC

(57) ABSTRACT

The invention relates to a method and a device (10) for localizing an insulation fault in an operating electrical equipment (8) connected to a power supply system (2). Fundamental function blocks of the invention are an electric monitoring device (12), which identifies an insulation fault and communicates a respective fault time to an identifying device (16) via a communication channel (14), said identifying device (16) identifying a faulty operating electrical equipment (8) by electrical equipment of a turning-on/-off signal progress characteristic to the particular operating electrical equipment (8).

6 Claims, 2 Drawing Sheets

(56) References Cited

FOREIGN PATENT DOCUMENTS

| | | |
|---|---|---|
| CN | 103201921 A | 7/2013 |
| CN | 104237645 A | 12/2014 |
| CN | 105514984 A | 4/2016 |
| DE | 3533523 A1 | 4/1986 |
| DE | 102011050346 A1 | 11/2012 |
| DE | 112011103159 | 7/2013 |
| EP | 1016869 A2 | 7/2000 |
| EP | 2796886 A1 | 10/2014 |

OTHER PUBLICATIONS

English Abstract Translation of CN104237645A dated Dec. 24, 2014.
English Abstract Translation of CN105514984A dated Apr. 20, 2016.

\* cited by examiner

METHOD AND DEVICE FOR LOCALIZING AN INSULATION FAULT IN AN OPERATING ELECTRICAL EQUIPMENT CONNECTED TO A POWER SUPPLY SYSTEM

BACKGROUND OF THE INVENTION

The invention relates to a method and a device for localizing an insulation fault in an operating electrical equipment connected to a power supply system.

The foundation for safely supplying electrical energy is based on reliable power supply systems. The high availability of power supply demands highly complex electric installations which are provided with protective and monitoring devices in order to identify faults on time and to be able to implement a time- and cost-saving fault localization.

In a grounded power supply system, an insulation fault can manifest itself as a residual current which does not trigger a fault-current protective device but in the long term poses an insidious threat in particular to people who come into contact with electrically conductive installation parts. In ungrounded power supply systems, a decreasing insulation resistance value can pose a risk to operational safety. It is thus necessary to duly identify, locate and eliminate as quickly as possible such insulation faults.

In grounded grids, residual-current monitors (RCM) are known to be used as electric monitoring devices which identify an (elevated) residual current in the power supply system. In ungrounded power supply systems, insulation monitoring devices are used as electrical monitoring devices which continuously examine whether the insulation resistance of the entire electric installation—the power supply system including the electric operating electrical equipment connected thereto such as consumers or generators—does not fall below a predetermined minimum value.

If an insulation fault is reported by the monitoring device, the fault is then generally identified but not yet localized in most instances. As a rule, the fault localization is a time- and cost-intensive task since the fault must be eliminated as quickly as possible but the fault location is as of yet unknown.

According to the contemporary state of the art the fault is either localized manually by electrical equipment of portable localizing devices or automatically using permanently installed fault localization devices, most of the time with the aid of measuring current transformers.

Depending on the desired local resolution, a plurality of measuring current transformers is required. The more selectivity is desired, the more measuring current transformers have to be installed. With a sufficient amount of measuring current transformers, a selectivity all the way to individual sockets can be attained which, however, disadvantageously encompasses a corresponding material and installation expenditure.

The fault localization is therefore often very cumbersome in particular in faults which occur in connected operating electrical equipment, such as consumers or generators.

SUMMARY OF THE INVENTION

The objective of the present invention is therefore to propose a method and a device which makes insulation fault localization for operating electrical equipment connected to a power supply system less time- and cost-intensive with respect to the state of the art.

This objective is attained by a method 100 comprising the following method steps as illustrated in FIG. 2:

continually capturing at least one electric measure in the power supply system as shown in step 102, identifying an instance of turning on/off in a temporal progress of the captured electric measure as shown in step 104, and assigning the instance of turning on/off to an operating electrical equipment effecting the instance of turning on/off via correlation calculations based on the captured electric measure and a stored signal progress characteristic to the operating electrical equipment as shown in step 106, recording all instances of turning on/off with turning on/off times and respective operating electrical equipment as shown in step 108, identifying the insulation fault with a respective fault time as shown in step 110, examining whether the fault time coincides with a recorded turning-on time as shown in step 112, should the fault time coincide with a recorded turning-on time, signaling that the fault occurred in the operating electrical equipment turned on at this turning-on time as shown in step 114.

During regular operation of the power supply system and the connected operating electrical equipment, an electric measure, such as a current or voltage progress (operating current or operating voltage), is continuously captured in the power supply system. The electric measure can be captured at a central location so that all current and voltage changes occurring in the power supply system under normal operating circumstances are considered in a measurement of the total current or the total voltage. The turning on and off of a specific operating electrical equipment, such as a drive motor, (instance of turning on/off) can be identified by electrical equipment of the measured temporal progress of the electric measure since each operating electrical equipment has an individual turning-on/-off behavior linked to a signal progress characteristic to this operating electrical equipment. This characteristic signal progress can be a temporal progress of the electric measure itself (current/voltage progress having current/voltage peaks) or a signal yielded therefrom, such as a frequency spectrum obtained by Fourier transformation.

Each such signal progress characteristic to the operating electrical equipment is stored for all operating electrical equipment to be monitored and is considered for identifying an instance of turning on/off in correlation calculations using the captured electric measure or using a signal yielded analogously to the stored characteristic signal progress from the electric measure in order to assign the instance of turning on/off to the operating electrical equipment effecting this instance.

All instances of turning on and all instances of turning off having respective turning-on/-off times and assigned operating electrical equipment are captured and recorded in a log file.

If an insulation fault having a respective fault time is reported by an electric monitoring device, e.g. by an insulation monitoring device or a residual-current monitoring device, this report first only provides the information that an insulation fault has occurred in the grid section monitored by the monitoring device. Whether an operating electrical equipment and which operating electrical equipment has triggered the fault is unknown.

To identify a faulty operating electrical equipment, it is therefore examined whether the fault time coincides with a recorded turning-on time of an operating electrical equipment. It is therefore determined whether an operating electrical equipment was turned on at the fault time. For this, the entries of the instances of turning on/off recorded in the log file are searched with the respective turning-on/-off times and the assigned operating electrical equipment. If the fault time coincides with a recorded turning-on time, the operating electrical equipment assigned to this turning-on time is identified as the fault source.

In terms of saving costs, a permanently installed fault localization device can thus be omitted. In particular when upgrading the electric installation with additional operating electrical equipment, no other fault localization devices have to be retrofitted.

With respect to a manual fault localization, the fault localization is designed to not require much time. In addition, the electric installation does not need to be turned off during the localization.

It is generally presumed in these observations that the insulation fault in the affected operating electrical equipment only minimally influences its turning-on/-off behavior, making the characteristic signal progress identical in the fault-free and faulty instance. By using the method according to the invention, the head start in information with regard to eliminating the fault source is used pre-emptively when slight changes in the insulation state of the electric installation first occur.

The characteristic signal progress is advantageously yielded in a learning mode from a one-off capturing of a temporal progress of the electric measure when turning the operating electrical equipment on and off.

If an operating electrical equipment is connected to the power supply system for the first time and should this operating electrical equipment be included in the fault localization, a characteristic signal progress has to be stored for this operating electrical equipment. This storage occurs in a learning mode by capturing a temporal progress of the electric measure, such as the current or the voltage, once when turning the operating electrical equipment on and off. For this purpose, the captured temporal progress itself or a signal yielded therefrom, such as the Fourier transform of the electric measure or a measure further processed using electrical equipment of digital signal processing (filtering), can be stored as a characteristic signal progress and can be consulted for being correlated to the currently detected electric measure or a signal yielded therefrom.

Furthermore, should the fault time not coincide with a recorded turning-on time, it is examined whether the fault time lies within a temporal interval of one of the operating electrical equipment formed by one of the turning-on times or one of the turning-off times.

The method according to the invention is only suitable for localizing faulty operating electrical equipment which are put into operation. The insulation fault has to have occurred before turning on the operating electrical equipment and has to make itself noticeable as such in a monitoring device at the time of being turned on. The fault time and a turning-on time have to coincide in order to be able to assign an operating electrical equipment to the fault. If no coincidence can be established, it can at least be detected which operating electrical equipment were turned on at the fault time via the examination of whether the fault time lies within a temporal interval of one of the operating electrical equipment formed by one of the turning-on times and one of the turning-off times. Consequently, the fault localization can be narrowed down and can thus provide faster results.

Besides the fault time, a fault end time is advantageously captured, stored and compared to the stored turning-off times of the operating electrical equipment for an identified and no longer persisting insulation fault.

As a complementing action, a fault end time can be compared to the stored turning-off times in order to identify a faulty operating electrical equipment also via its turning-off behavior in the event that an insulation fault, which disappears at this fault end time though, is present at the turning-on time.

The comparison of the fault end time to the stored turning-off times can be consulted for identifying a faulty operating electrical equipment even if the insulation fault first occurs when the operating electrical equipment has been turned on, i.e. the fault time does not coincide with a recorded turning-on time but the operating electrical equipment has been turned off in the meantime.

When implementing the method according to the invention, the objective of the invention is resolved by a device comprising an electric monitoring device for identifying an insulation fault with respective fault times, and an identification device connected to the monitoring device via a communication channel and serving to identify the faulty operating electrical equipment by electrical equipment of a signal progress, which is characteristic to the particular operating electrical equipment, when turning the operating electrical equipment on and off at a fault time.

Fundamental function blocks of the device according to the invention are an electric monitoring device, which identifies an insulation fault and communicates a respective fault time via a communication channel, and an identification device, which identifies a faulty operating electrical equipment by electrical equipment of a turning-on/-off signal progress characteristic to the respective operating electrical equipment.

Preferably, the electric monitoring device is configured as an insulation monitoring device in the ungrounded power supply system or as a residual-current monitoring device in the grounded power supply system.

As the insulation monitoring device, the electric monitoring device is installed at a central location in the power supply system and monitors the insulation resistance of the entire power supply system. If the insulation resistance falls below a minimal value in consequence of an insulation fault, a fault report is generated and communicated with the fault time.

The electric monitoring device can be configured as a residual-current monitoring device in the grounded power supply system. In this instance, the electric monitoring device comprises one or more measuring current transformers, which is/are installed in the power supply grid in order to identify residual currents which arise due to an insulation fault. If the residual current exceeds certain value, a fault report is generated and communicated with the fault time.

In an advantageous embodiment, the identifying device comprises the following devices:

- a capturing device for continuously capturing at least one electric measure in the power supply,
- an evaluation device for identifying an instance of turning on/off in a temporal progress of the captured electric measure and for assigning the instance of turning on/off to an operating electrical equipment effecting the instance of turning on/off,
- a storage device for recording all instances of turning on/off with a turning-on/-off time and assigned operating electrical equipment,
- a signaling device for examining whether the fault time/a fault end time coincides with a recorded turning-on time/turning-off time and for signaling the faulty operating electrical equipment.

The capturing device serves for continually capturing an electric measure at a central location in the power supply system. The electric measure can be a current or voltage progress which has features, such as current or voltage peaks or frequency portions, characteristic to this operating electrical equipment at a turning-on or turning-off time of an operating electrical equipment (instance of turning on/off).

The evaluation device identifies the instance of turning on/off in the temporal progress of the captured electric measure and can assign this instance—in the scope of the operating electrical equipment to be monitored—to the operating electrical equipment causing this instance since a characteristic signal progress is stored for each operating electrical equipment to be monitored, said signal progress being able to be correlated to the captured electric measure or to a signal yielded therefrom.

The storage device contains a log file in which all instances of turning on/off with turning-on/-off times and assigned operating electrical equipment are recorded.

As soon as a fault report with a fault time is transmitted to the identification device, the signaling device examines whether the fault time/a fault end time coincides with a recorded turning-on/-off time. If a coincidence is established, the faulty operating electrical equipment can be reported.

BRIEF DESCRIPTION OF THE DRAWINGS

The comparison of a fault end time to a turning-off time of the operating electrical equipment makes sense if the insulation fault first occurs after the operating electrical equipment was turned on and has since then disappeared again when the operating electrical equipment was turned off. In this instance, the faulty operating electrical equipment can be identified by electrical equipment of the characteristic signal progress at the turning off time.

DETAILED DESCRIPTION ON THE INVENTION

Figure 1:
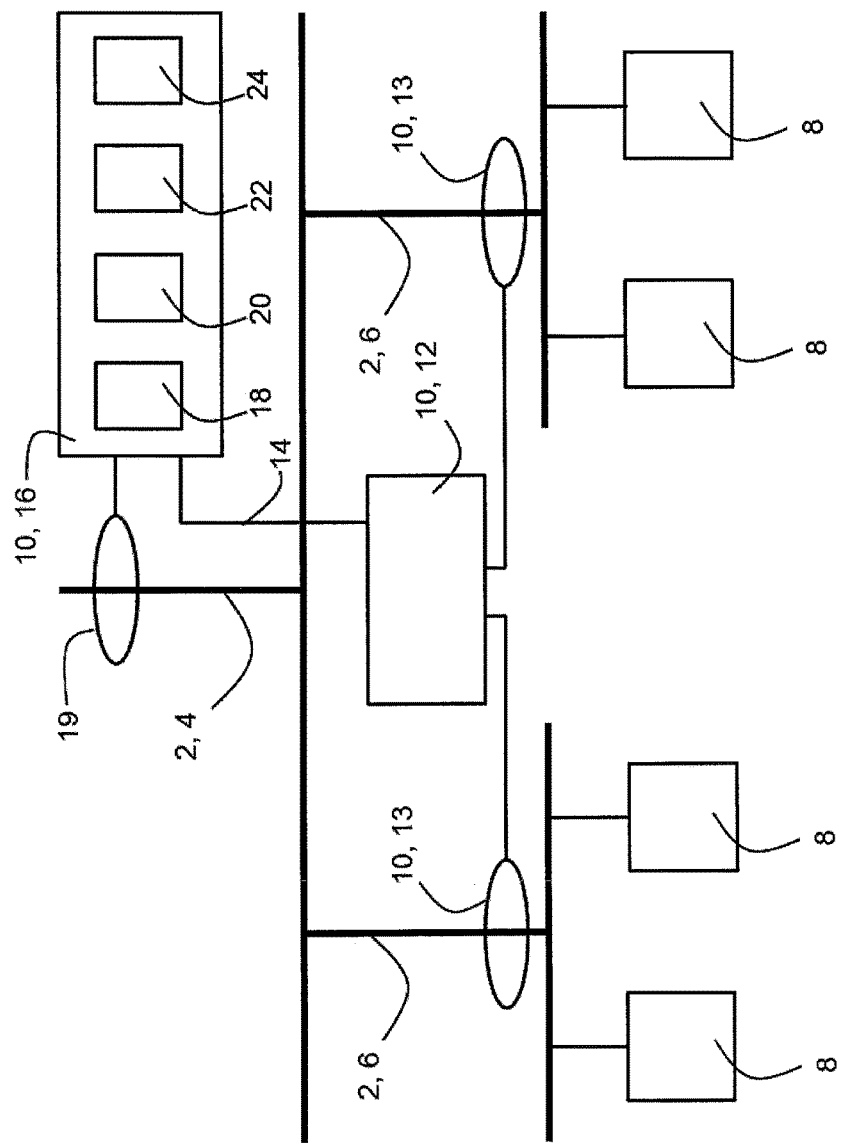

The advantageous features of the embodiments are explained in the following description and in the drawings, which explain in an exemplary manner a preferred embodiment of the device and method according to the invention.

Figure 2:
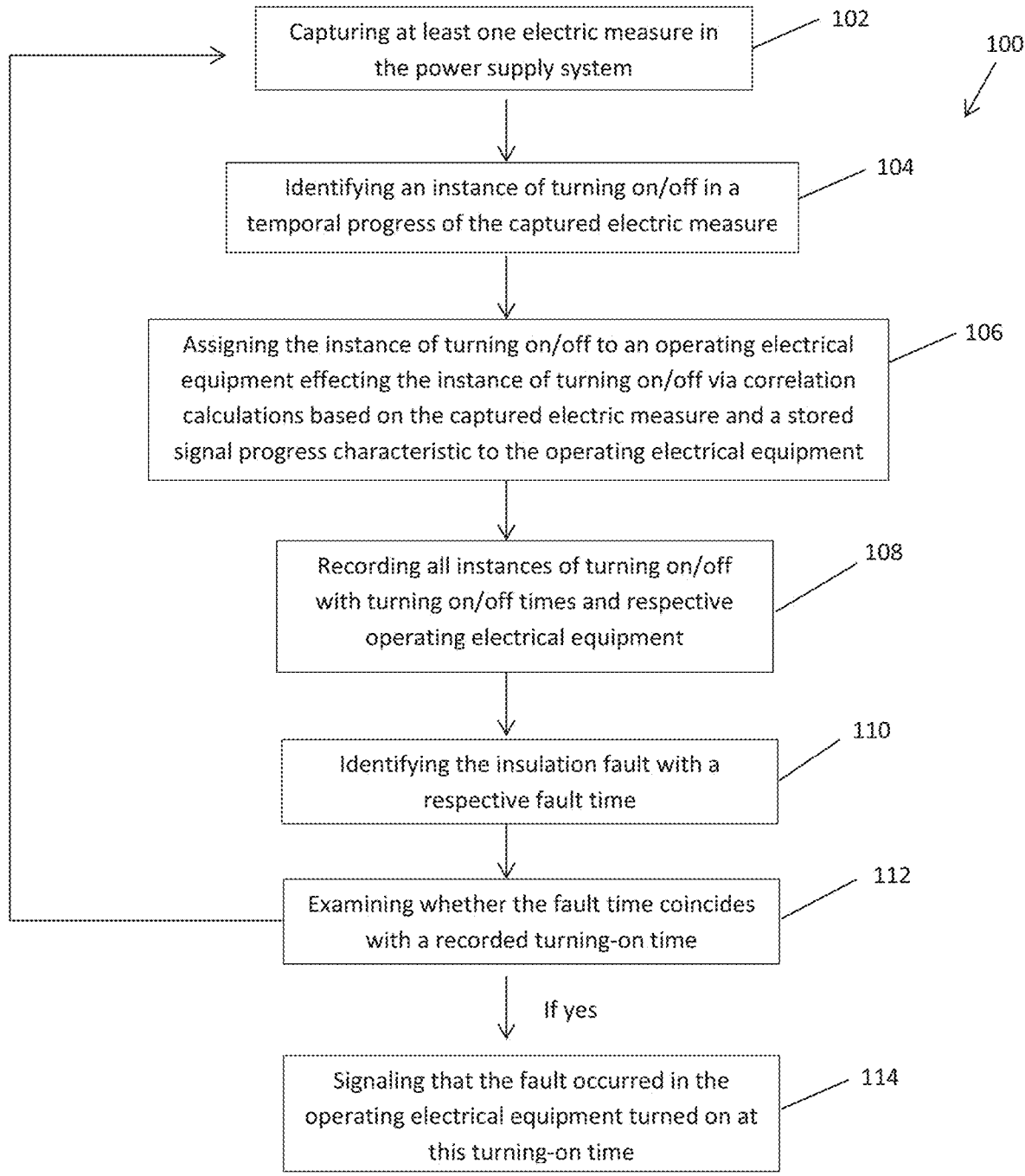

FIG. 1 illustrates in a schematic view a device according to the invention for localizing an insulation fault in an operating electrical equipment connected to a power supply system; and FIG. 2 illustrates a method according to the invention for localizing an insulation fault in an operating electrical equipment connected to a power supply.

Illustrated is a branched power supply system 2 which consists of a main system 4 and two subsystems 6. Consumers or generators are connected to the subsystems 6 as electric operating electrical equipment 8.

The device 10 according to the invention for localizing the insulation fault is illustrated in a functional block diagram and comprises an electric monitoring device 12, which is connected to an identification device 16 via a communication channel 14, as fundamental functional blocks.

In this instance, the electric monitoring device 12 is configured as a residual-current monitoring device having two measuring current transformers 13. The measuring current transformers 13 capture flowing residual currents in the subsystems 6 which occur if one of the operating electrical equipment 8 has an insulation fault. If a measured residual current exceeds a predetermined value, the residual-current monitoring device 12 generates a fault report and transfers this fault report with the respective fault time to the identification device 16 via the communication channel 14.

The identification device 16 comprises a capturing device 18, an evaluation device 20, a storage device 22 and a signaling device 24.

In the illustrated embodiment, a further measuring current transformer 19, which continuously captures an operating current as an electric measure at a central location in the main system 4 of the power supply system 2, also constitutes part of the capturing device 18. Advantageously, installing only one measuring current transformer 19 generally suffices.

Based on the captured temporal progress of the operating current and on characteristic signal progresses previously stored for the operating electrical equipment 8, the evaluation device 20 recognizes when an instance of turning on/off has occurred by electrical equipment of correlation calculations and assigns this instance with the respective turning-on/-off time to the effective operating electrical equipment 8.

As a result of these evaluations, a log file, in which all instances of turning on/off are recorded with the turning-on/-off time and the assigned operating electrical equipment 8, is created in the storage device 22.

If the electric monitoring device 12 now identifies a fault and transfers the respective fault time to the identification device 16, the signaling device 24 accesses the log file and searches it for whether the transmitted fault time coincides with a recorded turning-on time. Since an operating electrical equipment 8 is assigned to the turning-on time according to the log file, the signaling device 24 can identify and point out the operating electrical equipment 8 effecting faults should the fault time and the turning-on time coincide.

The schematic presentation illustrated in the FIGURE refers to a grounded power supply system 2. Should the power supply system be an ungrounded power supply system (2), the electric monitoring device (12) is configured as an insulation monitoring device which corresponds to the standard IEC 61557-8 and is connected to the identification device 16 via the communication channel 14 (as in the illustrated instance of the grounded power supply system 2).

The invention claimed is:

1. A method for localizing an insulation fault in a piece of operating electrical equipment (8) among a plurality of pieces of operating electrical equipment connected to a power supply system (2), comprising the method steps:

continually capturing at least one electric measure in the power supply system (2), identifying data associated with an instance of turning on/off in a temporal progression of the captured electric measure, and assigning the data associated with the instance of turning on/off to a respective one of the plurality of pieces of operating electrical equipment (8) effecting the instance of turning on/off via correlation calculations based on the captured electric measure and a stored signal progress characteristic to the respective one of the plurality of pieces of operating electrical equipment (8), recording all instances of turning on/off with turning on/off times and each respective piece of operating electrical equipment (8) among the plurality of pieces of operating electrical equipment, identifying the insulation fault with a respective fault time, examining whether the fault time coincides with a recorded turning-on time, should the fault time coincide with a recorded turning-on time, signaling that the fault occurred in the respective piece of operating electrical equipment (8) turned on at this turning-on time.

2. The method according to claim 1, characterized in that the characteristic signal progress is yielded in a learning mode by capturing once a temporal progress of the electric measure when turning the operating electrical equipment (8) on and off.

3. The method according to claim 1, characterized in that should the fault time not coincide with a recorded turning-on time, it is examined whether the fault time lies within a temporal interval of one of the plurality of pieces of operating electrical equipment (8) which is formed by one of the turning-on times and one of the turning-off times.

4. The method according to claim 1, characterized in that for an identified and no longer persisting insulation fault, a fault end time is captured, stored and compared to the stored turning-off times of the plurality of pieces of operating electrical equipment (8) in addition to the fault time.

5. A device (10) for localizing an insulation fault in a faulty piece of operating electrical equipment (8) among a plurality of pieces of operating electrical equipment connected to a power supply system (2), comprising:
- an electric monitoring device (12) for identifying the insulation fault with a respective fault time, and an identifying device (16) connected to the monitoring device (12) via a communication channel (14) and serving to identify the faulty piece of operating electrical equipment (8) by means of a signal progress characteristic to the particular faulty piece of operating electrical equipment (8) when turning the faulty piece of operating electrical equipment (8) on and off at a fault time;

wherein the identifying device (16) comprises
- a capturing device (18) for continually capturing at least one electric measure in the power supply system,
- an evaluation device (20) for identifying data associated with an instance of turning on/off in a temporal progression of the captured electric measure and for assigning the data associated with the instance of turning on/off to an operating electrical equipment effecting the turning on/off,
- a storage device (22) for recording data associated with all instances of turning on/off with a respective turning-on/-off time and respective pieces of operating electrical equipment among the plurality of pieces of operating electrical equipment,
- a signaling device (24) for examining whether the fault time/a fault end time coincides with a recorded turning-on/-off time and for signaling the faulty operating electrical equipment (8).

6. The device (10) according to claim 5, characterized in that the electric monitoring device (12) is configured as an insulation monitoring device or a residual-current monitoring device.

* * * * *